United States Patent
Kim

(10) Patent No.: US 10,782,349 B2
(45) Date of Patent: Sep. 22, 2020

(54) TEST INTERFACE BOARD HAVING A TRANSMISSION LINE TO MERGE SIGNALS, TEST METHOD USING THE SAME, AND TEST SYSTEM INCLUDING THE SAME

(71) Applicant: SAMSUNG ELECTRONICS CO., LTD., Suwon-si, Gyeonggi-Do (KR)

(72) Inventor: Yongjeong Kim, Cheonan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 143 days.

(21) Appl. No.: 15/871,278

(22) Filed: Jan. 15, 2018

(65) Prior Publication Data

US 2019/0004113 A1    Jan. 3, 2019

(30) Foreign Application Priority Data

Jul. 3, 2017    (KR) .................. 10-2017-0084197

(51) Int. Cl.

| | |
|---|---|
| *G01R 31/319* | (2006.01) |
| *G01R 31/3181* | (2006.01) |
| *G11C 29/00* | (2006.01) |
| *G01R 31/28* | (2006.01) |
| *G11C 29/48* | (2006.01) |
| *G11C 29/56* | (2006.01) |
| *G01R 1/073* | (2006.01) |
| *G01R 31/3185* | (2006.01) |
| *G11C 29/20* | (2006.01) |

(52) U.S. Cl.
CPC ... *G01R 31/31926* (2013.01); *G01R 1/07378* (2013.01); *G01R 31/2863* (2013.01); *G01R 31/31813* (2013.01); *G11C 29/003* (2013.01); *G11C 29/48* (2013.01); *G11C 29/56004* (2013.01); *G11C 29/56012* (2013.01); *G01R 31/318511* (2013.01); *G11C 29/20* (2013.01); *G11C 29/56* (2013.01); *G11C 2029/5602* (2013.01)

(58) Field of Classification Search
None
See application file for complete search history.

(56) References Cited

U.S. PATENT DOCUMENTS

| | | | |
|---|---|---|---|
| 5,481,671 | A | 1/1996 | Fujisaki |
| 5,889,786 | A | 3/1999 | Shimogama |

(Continued)

FOREIGN PATENT DOCUMENTS

| | | |
|---|---|---|
| JP | H10-177059 | 6/1998 |
| KR | 10-1368000 | 3/2014 |
| KR | 10-1443877 | 9/2014 |

*Primary Examiner* — Phung M Chung
(74) *Attorney, Agent, or Firm* — F. Chau & Associates, LLC

(57) ABSTRACT

A test interface board includes a first input terminal, a second input terminal, an output terminal, and a transmission line. The first input terminal receives a first test signal for testing a semiconductor device. The second input terminal receives a second test signal for testing the semiconductor device. The output terminal outputs the first test signal and the second test signal to the semiconductor device. The transmission line electrically connects the first input terminal, the second input terminal, and the output terminal such that the first test signal and the second test signal are merged.

13 Claims, 12 Drawing Sheets

(56) References Cited

U.S. PATENT DOCUMENTS

| | | | |
|---|---|---|---|
| 5,912,899 A * | 6/1999 | Kim | G11C 7/1006 |
| | | | 714/718 |
| 6,019,501 A | 2/2000 | Okazaki | |
| 6,363,022 B2 | 3/2002 | Tsuto | |
| 6,366,109 B1 | 4/2002 | Matsushita | |
| 6,490,700 B1 | 12/2002 | Oshima et al. | |
| 6,567,939 B1 * | 5/2003 | Kim | G11C 29/02 |
| | | | 365/201 |
| 7,032,145 B1 | 4/2006 | Burlison | |
| 7,464,309 B2 * | 12/2008 | Seo | G11C 29/12 |
| | | | 365/201 |
| 7,707,469 B2 * | 4/2010 | Lee | G11C 29/02 |
| | | | 326/30 |
| 7,872,488 B2 * | 1/2011 | Kang | G01R 31/31932 |
| | | | 324/762.02 |
| 2010/0030508 A1 * | 2/2010 | Gake | G01R 31/31928 |
| | | | 702/117 |
| 2011/0099443 A1 | 4/2011 | Ishida et al. | |
| 2013/0342236 A1 * | 12/2013 | Song | G01R 1/0408 |
| | | | 324/756.07 |
| 2015/0236715 A1 * | 8/2015 | Alhussien | H03M 7/40 |
| | | | 341/67 |

\* cited by examiner

US 10,782,349 B2

1

TEST INTERFACE BOARD HAVING A TRANSMISSION LINE TO MERGE SIGNALS, TEST METHOD USING THE SAME, AND TEST SYSTEM INCLUDING THE SAME

CROSS-REFERENCE TO RELATED APPLICATION

This U.S. non-provisional patent application claims priority under 35 U.S.C. § 119 to Korean Patent Application No. 10-2017-0084197, filed on Jul. 3, 2017 in the Korean Intellectual Property Office, the disclosure of which is incorporated by reference herein in its entirety.

TECHNICAL FIELD

Exemplary embodiments of the inventive concept relate to a test interface board, a test method, and a test system, and more particularly, to a test interface board having a transmission line to merge signals, a test method using the same, and a test system including the same.

DISCUSSION OF THE RELATED ART

A tester is used to test semiconductor devices. Since the tester generally is a relatively high-priced apparatus, even though a new semiconductor device is developed, the new semiconductor device may be tested with an existing tester. Test interface boards are used to connect the existing tester with various semiconductor devices.

A test interface board may include an additional circuit capable of supporting functions that the existing tester lacks. However, manufacturing costs and manufacturing difficulty of the test interface board may be increased due to the additional circuit.

SUMMARY

According to an exemplary embodiment of the inventive concept, a test interface board may include a first input terminal, a second input terminal, an output terminal, and a transmission line. The first input terminal may receive a first test signal for testing a semiconductor device. The second input terminal may receive a second test signal for testing the semiconductor device. The output terminal may output the first test signal and the second test signal to the semiconductor device. The transmission line may electrically connect the first input terminal, the second input terminal, and the output terminal such that the first test signal and the second test signal are merged.

According to an exemplary embodiment of the inventive concept, a method for testing a semiconductor device, by using a test interface board configured to output, through one output terminal, a plurality of test signals input through a plurality of input terminals, may include generating the plurality of test signals from a plurality of buffers and an algorithm pattern generator (ALPG) of a tester connected to the test interface board, and transmitting the plurality of test signals to the test interface board at different time points.

According to an exemplary embodiment of the inventive concept, a test system may include a semiconductor device and a test interface board. The test interface board may include input terminals receiving test signals for testing the semiconductor device, an output terminal outputting the test signals as a merged signal to the semiconductor device, and a transmission line electrically connecting the input terminals and the output terminal.

BRIEF DESCRIPTION OF THE DRAWINGS

The above and other objects and features of the inventive concept will become apparent by describing in detail exemplary embodiments thereof with reference to the accompanying drawings.

DETAILED DESCRIPTION OF THE EMBODIMENTS

Figure 1:
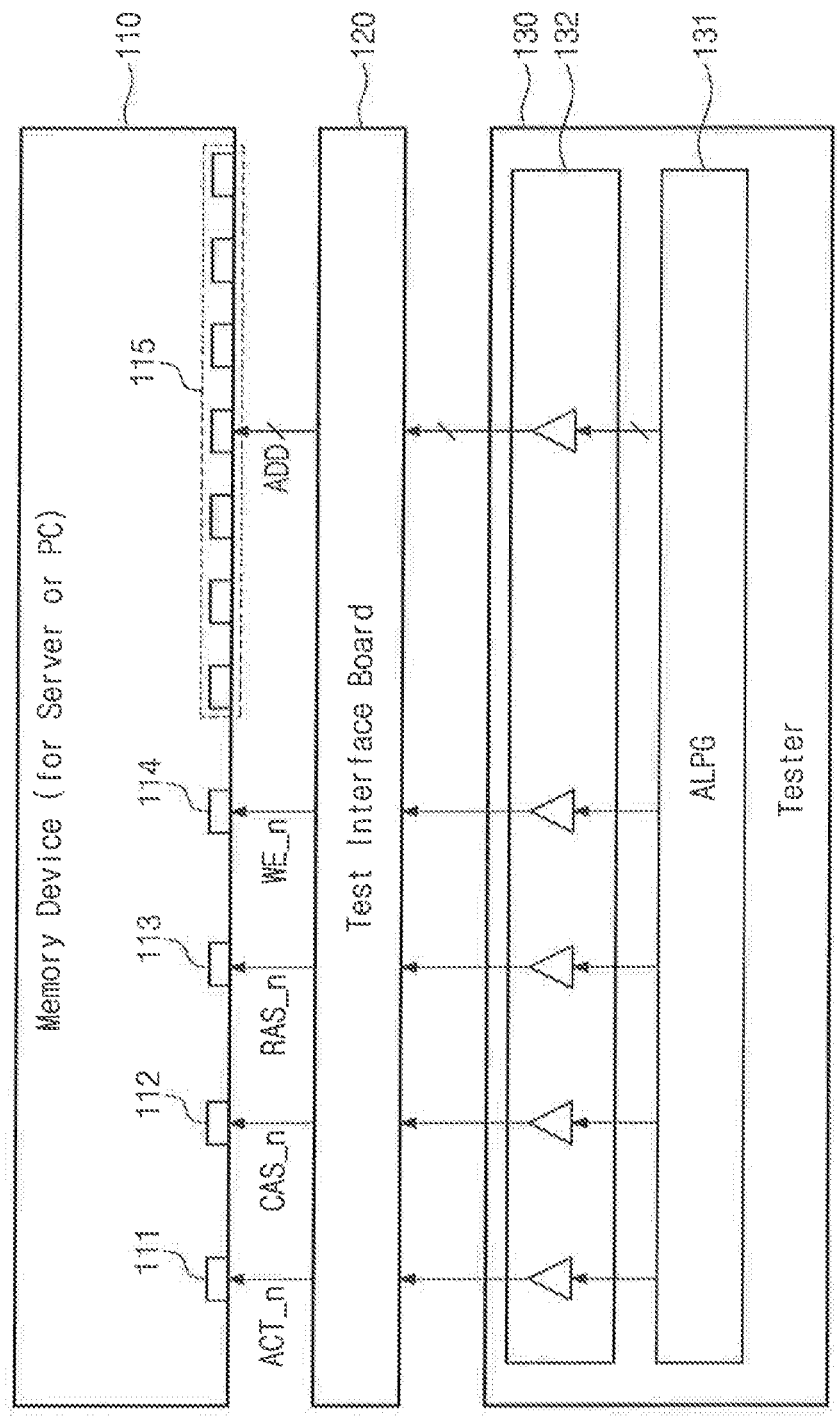
FIG. 1 is a block diagram illustrating a test system of a memory device according to an exemplary embodiment of the inventive concept.

Exemplary embodiments of the inventive concept provide a test interface board having a transmission line to merge signals, and a test method and a test system using the same.

Exemplary embodiments of the inventive concept will be described in detail hereinafter. Like reference numerals may refer to like elements throughout this application.

FIG. 1 is a block diagram illustrating a test system of a memory device according to an exemplary embodiment of the inventive concept. Referring to FIG. 1, a test system 100 may include a memory device 110, a test interface board 120, and a tester 130.

The memory device 110 may be a dynamic random access memory (DRAM), a static random access memory (SRAM), a read only memory (ROM), a programmable ROM (PROM), an electrically programmable ROM (EPROM), an electrically erasable and programmable ROM (EEPROM), a NAND flash memory, a NOR flash memory, a magnetic random access memory (MRAM), a phase-change random access memory (PRAM), a resistive random access memory (RRAM), a ferroelectric random access memory (FRAM), a thyristor random access memory (TRAM), a solid state drive (SSD), a hard disk drive (HDD), etc. In FIG. 1, it is assumed that the memory device 110 is a DRAM following a Joint Electron Device Engineering Council (JEDEC) standard.

For example, the memory device 110 may be a DRAM for a server or a personal computer (PC). The memory device 110 may include an ACT_n terminal 111, a CAS_n terminal 112, a RAS_n terminal 113, a WE_n terminal 114, and ADD terminals 115. The ACT_n terminal 111, the CAS_n terminal 112, the RAS_n terminal 113, and the WE_n terminal 114 are terminals for receiving an activation command, a write command, a read command, a precharge command, a refresh command, etc. from the tester 130 or a memory controller. The ADD terminals 115 are terminals for receiving a row address, a column address, and a bank address of a memory cell corresponding to the above-described commands.

In FIG. 1, command terminals (e.g., the ACT_n terminal 111, the CAS_n terminal 112, the RAS_n terminal 113, and the WE_n terminal 114) and the ADD terminals 115 are illustrated as being separated from one another; however, according to the DDR4 standard, the CAS_n terminal 112, the RAS_n terminal 113, and the WE_n terminal 114 may receive an "A16" address value, an "A15" address value, and an "A14" address value, respectively.

The test interface board 120 may connect the memory device 110 and the tester 130. In detail, the test interface board 120 may transmit commands and addresses for controlling the memory device 110 from the tester 130 to the memory device 110. To this end, the test interface board 120 may be manufactured depending on a configuration of terminals of the memory device 110.

The tester 130 may generate test signals to be transmitted to the memory device 110 depending on a test pattern. Here, the test pattern is a pattern for testing reliability, power, an input/output speed, a function, etc. of the memory device 110. In detail, the tester 130 may transmit test signals, corresponding to a test pattern, to the memory device 110, and may receive an operation result of the memory device 110, depending on the test pattern, from the memory device 110. The tester 130 may test the performance of the memory device 110 with reference to the received operation result.

The tester 130 may include an algorithm pattern generator (ALPG) 131 and buffers 132. The algorithm pattern generator 131 may calculate logical values of commands included in a test pattern. The calculated logical values may be stored in a memory of the algorithm pattern generator 131. The buffers 132 may transmit the calculated logical values (e.g., test signals) to the test interface board 120 under control of the algorithm pattern generator 131.

The memory device 110 is illustrated in FIG. 1 as including terminals receiving commands and addresses from the tester 130. The memory device 110 may further include additional terminals (e.g., a CK terminal, a DQ terminal (a data input/output terminal), a DQS terminal, a VDD terminal, a VSS terminal, a CS_n terminal, a DM_n terminal, a DBI_n terminal, a CKE terminal, and/or an ALERT_n terminal) for receiving a clock, write data, power, and other commands through the test interface board 120 from the tester 130. In particular, the memory device 110 may transmit read data to the tester 130 through the DQ terminal (the data input/output terminal).

Figure 2:
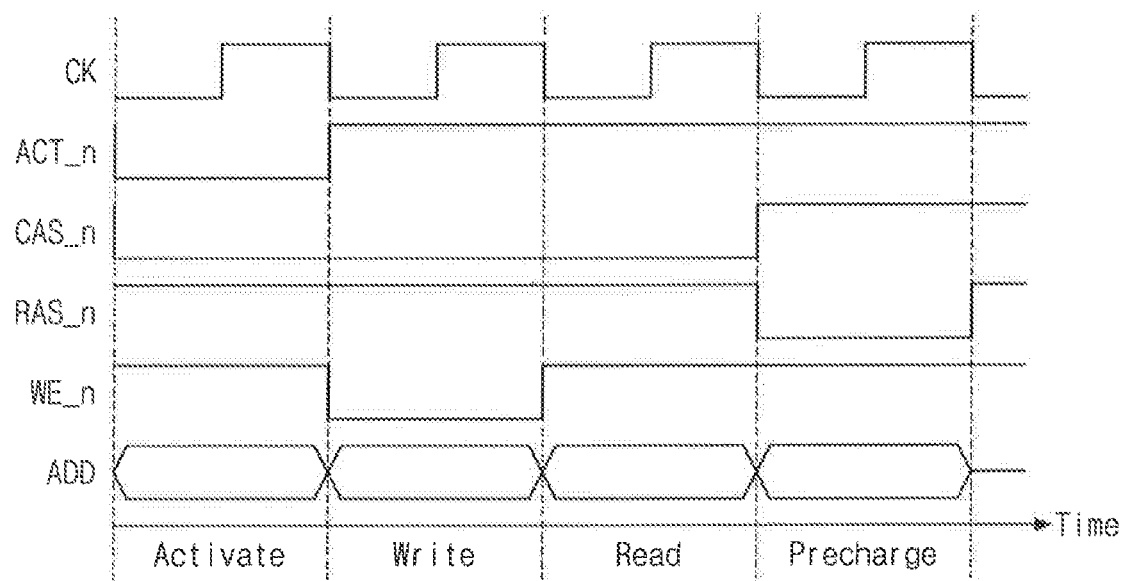
FIG. 2 is a view illustrating waveforms of test signals applied to a memory device in the test system of FIG. 1 according to an exemplary embodiment of the inventive concept.

FIG. 2 is a view illustrating waveforms of test signals applied to a memory device in the test system of FIG. 1 according to an exemplary embodiment of the inventive concept. FIG. 2 will be described with reference to FIG. 1.

Referring to FIG. 2, an activation command, a write command, a read command, and a precharge command may be sequentially applied to the memory device 110. Additionally, addresses of a memory cell to be tested by the tester 130 may be applied to the memory device 110 together with the above-described commands. Commands and addresses may be applied to the memory device 110 in a single data rate (SDR) manner.

Delays (e.g., tRCD (RAS to CAS delay), CL (CAS latency), tRP (RAS precharge)), defined in advance based on the JEDEC specification, may be necessary between commands for controlling the memory device 110 due to characteristics of a memory cell. The above-described delays may not be considered in FIG. 2; however, since a frequency of a clock CK is very low in a test environment, commands may be applied to the memory device 110 as illustrated in FIG. 2. Additionally, to test the above-described delays, commands may be applied to the memory device 110 as illustrated in FIG. 2.

Signals of the ACT_n terminal 111, the CAS_n terminal 112, the RAS_n terminal 113, and the WE_n terminal 114 may be activated when at a low level (logic "0"). For example, in the case of the activation command, a signal of the ACT_n terminal 111 may be low. In this case, the memory device 110 may decode signals of the CAS_n terminal 112, the RAS_n terminal 113, and the WE_n terminal 114 to A16, A15, and A14 address values based on the JEDEC specification. In the case of the write command, signals of the CAS_n terminal 112 and the WE_n terminal 114 may be low. In the case of the read command, a signal of the CAS_n terminal 112 may be low. In the case of the precharge command, a signal of the RAS_n terminal 113 may be low.

The memory device 110 may decode commands received through the ACT_n terminal 111, the CAS_n terminal 112, the RAS_n terminal 113, and the WE_n terminal 114 and may process the received commands with reference to addresses received through the ADD terminals 115.

Figure 3:
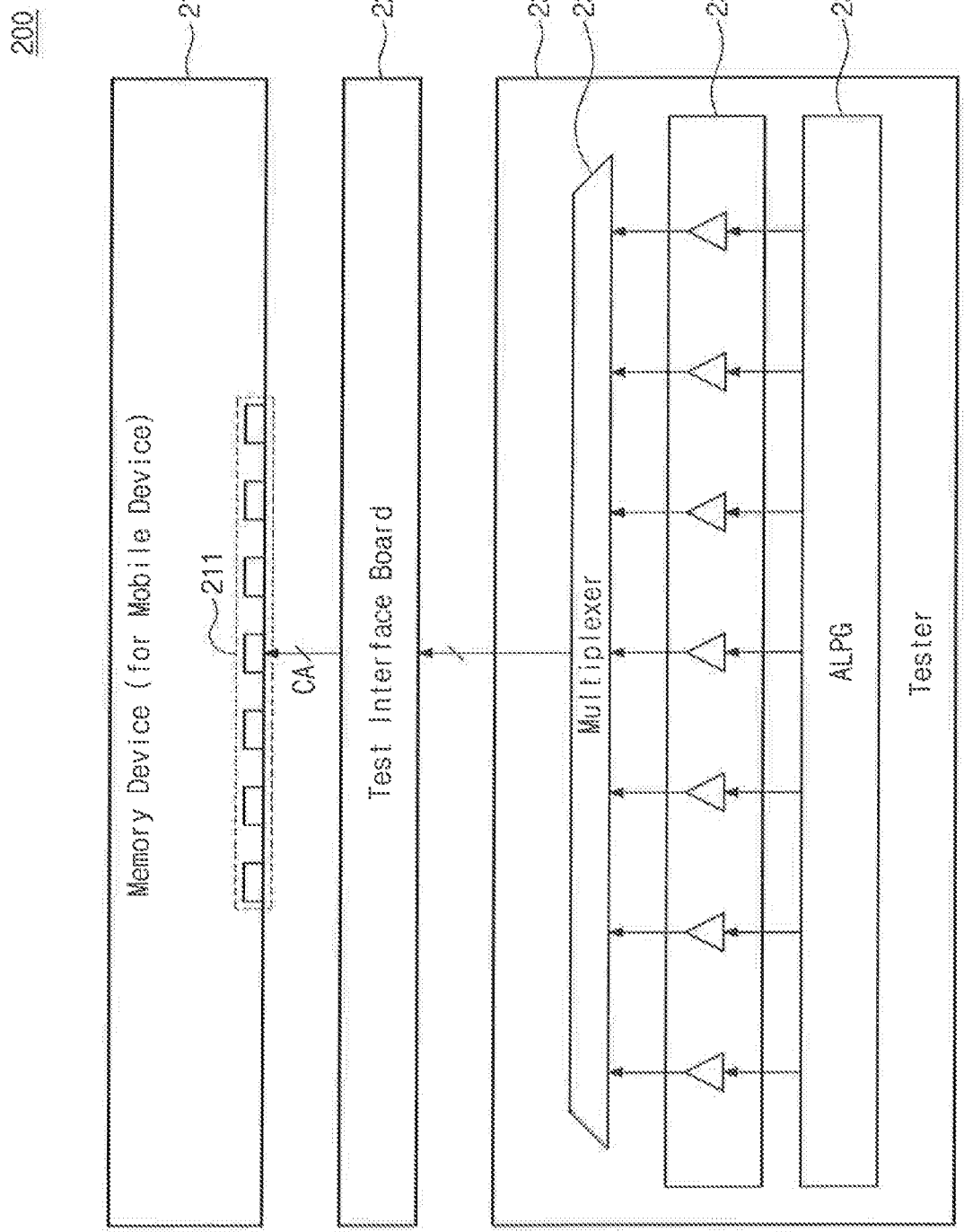
FIGS. 3 and 4 are block diagrams illustrating other test systems for testing a memory device according to exemplary embodiments of the inventive concept.
Figure 4:
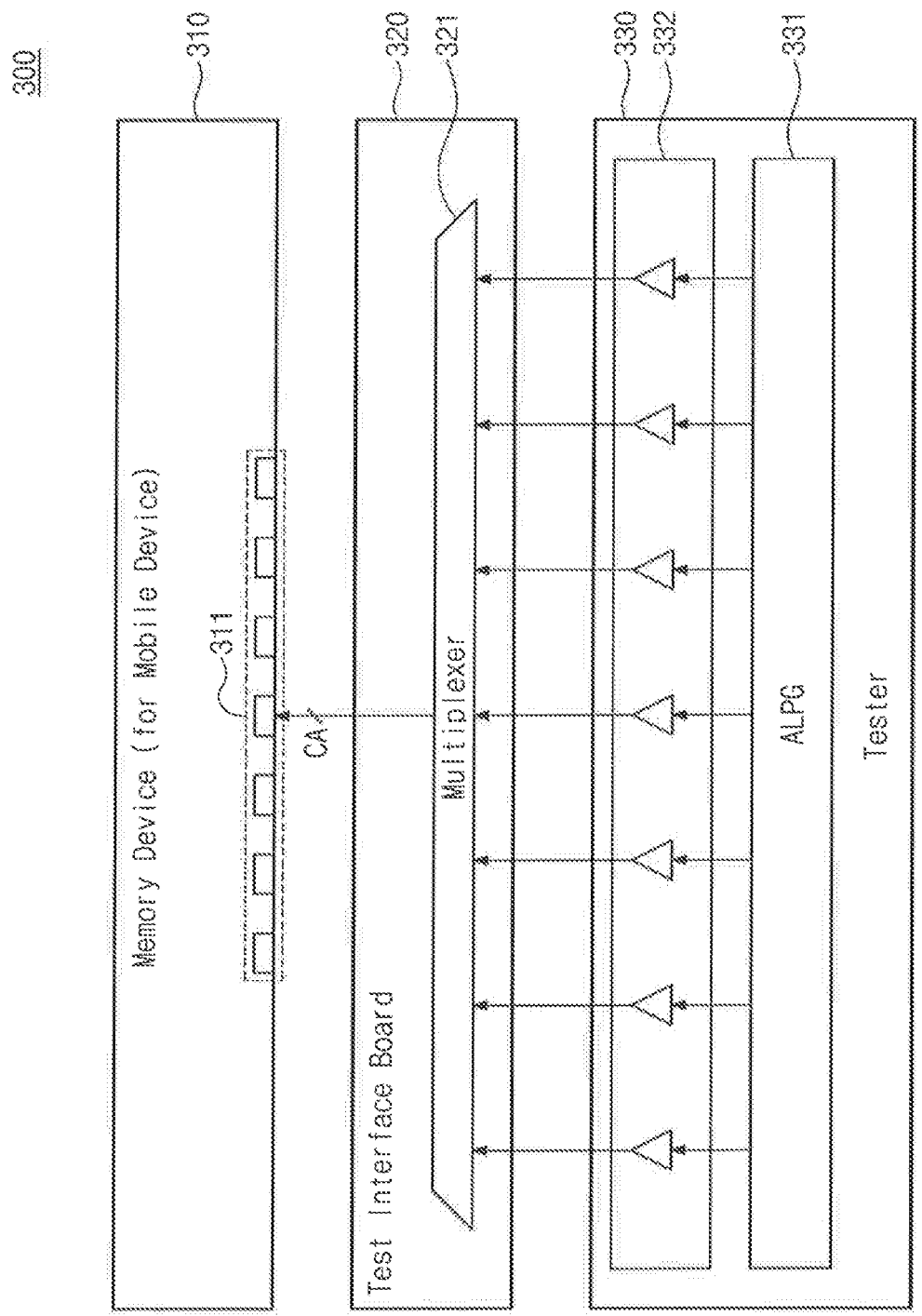

FIGS. 3 and 4 are block diagrams illustrating other test systems for testing a memory device according to exemplary embodiments of the inventive concept. Unlike the memory device 110 that is a DRAM for a server or PC of FIG. 1, each of memory devices 210 and 310 of FIGS. 3 and 4, respectively, may be a DRAM for a mobile device. Unlike the DRAM for a server or PC, in the DRAM for a mobile device, terminals receiving commands and terminals receiving addresses may be merged to reduce the area (e.g., pin scramble). The memory devices 210 and 310 may include command/address (CA) terminals 211 and 311, respectively, instead of the ACT_n terminal 111, the CAS_n terminal 112, the RAS_n terminal 113, the WE_n terminal 114, and the ADD terminals 115 of the memory device 110.

Referring to FIG. 3, in a test system 200, to test the memory device 210, a tester 230 may further include a multiplexer 233, unlike the tester 130 of FIG. 1. The multiplexer 233 may merge test signals (e.g., outputs of buffers 232) for testing the memory device 210. Here, an algorithm pattern generator 231 and the buffers 232 may perform substantially the same function as the algorithm pattern generator 131 and the buffers 132 of FIG. 1. A test interface board 220 may transmit a merged signal to the memory device 210. The test interface board 220 may be manufactured depending on a configuration of terminals of the memory device 210, and thus may be different from the test interface board 120 of FIG. 1.

Since the testers 130 and 230 are relatively high-priced apparatuses, generally, it is efficient to use a tester without modification or replacement regardless of the development of a new memory device or types of memory devices in the test systems 100 and 200. In other words, for example, it may be more efficient to test the memory device 210 by using the tester 130 of FIG. 1 instead of the tester 230 that further includes a hardware element (e.g., the multiplexer 233).

Referring to FIG. 4, in a test system 300, the tester 330, which is substantially the same as the tester 130 of FIG. 1, may be used without modification or replacement to test the memory device 310. Here, an algorithm pattern generator 331 and buffers 332 in the tester 330 may perform substantially the same function to generate test signals as the algorithm pattern generator 131 and the buffers 132 of FIG. 1. However, to merge test signals from the tester 330, a test interface board 320 may further include a multiplexer 321, unlike the test interface board 120 of FIG. 1. The multiplexer 321 may perform substantially the same function as the multiplexer 233 of FIG. 3. However, since a power circuit for driving the multiplexer 321, a circuit for preventing heat generation, and/or the like may be added to the test interface board 320, manufacturing costs and manufacturing difficulty of the test interface board 320 may be increased.

Figure 5:
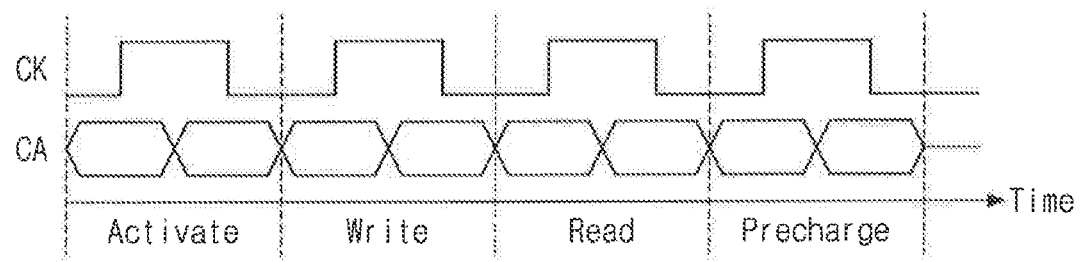
FIG. 5 is a view illustrating waveforms of test signals applied to memory devices in the test systems of FIGS. 3 and 4 according to an exemplary embodiment of the inventive concept.

FIG. 5 is a view illustrating waveforms of test signals applied to memory devices in test systems of FIGS. 3 and 4 according to an exemplary embodiment of the inventive concept. FIG. 5 will be described with reference to FIGS. 3 and 4.

Referring to FIG. 5, as in FIG. 2, an activation command, a write command, a read command, and a precharge command may be sequentially applied to the memory devices 210 and 310. However, unlike in FIG. 2, commands and addresses may be applied to the memory devices 210 and 310 in a double data rate (DDR) manner.

In detail, the memory devices 210 and 310 may decode signals of the CA terminals 211 and 311 to a command at a rising edge of the clock CK and may decode signals of the CA terminals 211 and 311 to an address at a falling edge of the clock CK. Commands to be applied to the memory devices 210 and 310 are summarized in the following Table 1.

Table 1 shows states of command terminals and CA terminals so that the MPC, PRE, REF, SRE, SRX, WR-1, and MWR-1 commands are applied to the memory devices 210 and 310. In Table 1, "H" may represent that a signal of the corresponding terminal is high (corresponding to logic "1"), "L" may represent that a signal of the corresponding terminal is low (corresponding to logic "0"), OP0 to OP6 may represent data as an operation (OP) code, and BA0 to BA2 may represent addresses of banks of the memory devices 210 and 310. Additionally, "AB" may represent whether the corresponding command is applied to a single bank or to all banks, "AP" may represent whether to perform auto-precharge, "BL" may represent a burst length of the memory devices 210 and 310, "V" may represent that a signal of the corresponding terminal is validly decoded by the memory devices 210 and 310, and "C9" may represent a control bit of the memory devices 210 and 310. However, in Table 1, types of commands, the number and states of CA terminals, the number or states of command terminals, and edges of the clock CK are only an example.

Hereinafter, a test system that is able to test a memory device receiving a merged signal (e.g., a signal to which a test signal for a command and a test signal for an address are merged) through one terminal without the multiplexers 233 and 321 of FIGS. 3 and 4 will be described below.

Figure 6:
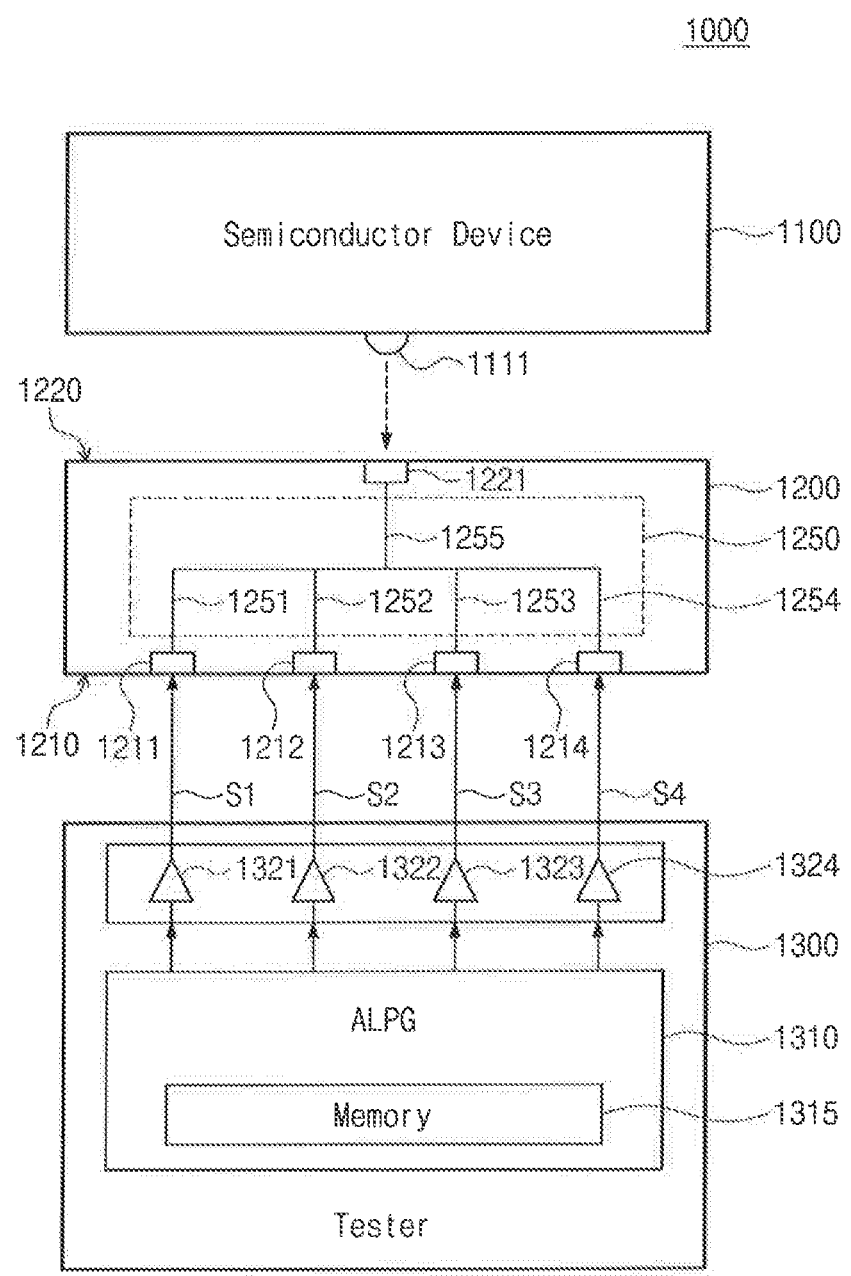
FIG. 6 is a block diagram illustrating a test system according to an exemplary embodiment of the inventive concept.

FIG. 6 is a block diagram illustrating a test system according to an exemplary embodiment of the inventive concept. Referring to FIG. 6, a test system 1000 may include a semiconductor device 1100, a test interface board 1200, and a tester 1300.

In an exemplary embodiment of the inventive concept, the semiconductor device 1100 may be one of various memory devices described with reference to FIGS. 1, 2, and 3, or may be a non-memory device such as a central processing unit (CPU), a graphics processing unit (GPU), a microprocessor, a controller, an application specific integrated circuit (ASIC), a field programmable gate array (FPGA), a system on chip (SoC), etc.

TABLE 1

| Command | Command Pins CKE | | | CA Pins | | | | | | | |
|---|---|---|---|---|---|---|---|---|---|---|---|
| | CK (n-1) | CK (n) | CS | CA0 | CA1 | CA2 | CA3 | CA4 | CA5 | | CK edge |
| Multi Purpose Command (MPC) | H | H | H | L | L | L | L | L | OP6 | | R1 |
| | | | L | OP0 | OP1 | OP2 | OP3 | OP4 | OP5 | | R2 |
| Precharge (PRE) (Per Bank, All Bank) | H | H | H | L | L | L | L | H | AB | | R1 |
| | | | L | BA0 | BA1 | BA2 | V | V | V | | R2 |
| Refresh (REF) (Per Bank, All Bank) | H | H | H | L | L | L | H | L | AB | | R1 |
| | | | L | BA0 | BA1 | BA2 | V | V | V | | R2 |
| Self Refresh Entry (SRE) | H | H | H | L | L | L | H | H | V | | R1 |
| | | | L | | | V | | | | | R2 |
| Self Refresh Exit (SRX) | H | H | H | L | L | H | L | H | V | | R1 |
| | | | L | | | V | | | | | R2 |
| Write-1 (WR-1) | H | H | H | L | L | H | L | L | BL | | R1 |
| | | | L | BA0 | BA1 | BA2 | V | C9 | AP | | R2 |
| Masked Write-1 (MWR-1) | H | H | H | L | L | H | H | L | L | | R1 |
| | | | L | BA0 | BA1 | BA2 | V | C9 | AP | | R2 |

MPC, PRE, REF, SRE, SRX, WR-1, and MWR-1 commands may be input to the memory devices 210 and 310 at R1 and R2 edges of the clock CK. Here, as illustrated in FIG. 5, the R1 edge may indicate a rising edge of the clock CK, and the R2 edge may indicate a falling edge of the clock CK.

The semiconductor device 1100 may include an input terminal 1111. When the semiconductor device 1100 receives a command from another device (e.g., the tester 1300), at least two or more test signals corresponding to the command may be transmitted to the semiconductor device

1100. In this case, to reduce a chip size, the semiconductor device 1100 may include terminals of which a total number is smaller than a total number of test signals, as opposed to having one-to-one correspondence. In detail, the semiconductor device 1100 may receive a signal, to which test signals corresponding to a command are merged, through the input terminal 1111. Here, the number of test signals merged may be at least 2 or more.

In an exemplary embodiment of the inventive concept, the input terminal 1111 may receive a signal, to which the test signals are merged, in a manner similar to the CA terminals 211 and 311 of FIGS. 3 and 4. For example, in the case where the semiconductor device 1100 is one of the memory devices 210 and 310 of FIGS. 3 and 4, the input terminal 1111 may be one of the CA terminals 211 and 311.

In an exemplary embodiment of the inventive concept, the semiconductor device 1100 is illustrated as a package having a form of a ball grid array (BGA), and the input terminal 1111 is illustrated as a ball. In this case, the input terminal 1111 may be directly in contact with an output terminal 1221 of the test interface board 1200, which will be described below.

In an exemplary embodiment of the inventive concept, the semiconductor device 1100 may be a wafer before a packaging process is performed. In this case, the input terminal 1111 may be a pad. The pad may be in contact with a needle of the test interface board 1200.

The test interface board 1200 may include first to fourth input terminals 1211 to 1214, the output terminal 1221, and a transmission line 1250.

The first to fourth input terminals 1211 to 1214 are terminals to be electrically connected to the tester 1300. The first to fourth input terminals 1211 to 1214 may receive first to fourth test signals S1 to S4, respectively, from the tester 1300. The first to fourth input terminals 1211 to 1214 may be disposed on a first plane 1210. The output terminal 1221 may be disposed on a second plane 1220. The first plane 1210 and the second plane 1220 may be a bottom plane and a top plane, respectively, of the test interface board 1200. Referring to FIG. 6, the number of the first to fourth input terminals 1211 to 1214 is four. However, the inventive concept is not limited thereto. For example, the number of input terminals may be at least 2 or more.

The output terminal 1221 is a terminal to be electrically connected to the semiconductor device 1100. For example, the output terminal 1221 may be in contact with the input terminal 1111 of the semiconductor device 1100. One output terminal 1221 is illustrated in FIG. 6. However, the number of output terminals may be changed depending on the number of the first to fourth input terminals 1211 to 1214 or a terminal configuration of the semiconductor device 1100.

Unlike the test interface board 320 of FIG. 4, the test interface board 1200 may not include a circuit (e.g., the multiplexer 321 of FIG. 4) configured to merge the first to fourth test signals S1 to S4 input through the first to fourth input terminals 1211 to 1214, and may include the transmission line 1250. The test interface board 1200 may output the first to fourth test signals S1 to S4, which are input through the first to fourth input terminals 1211 to 1214, to the output terminal 1221. The transmission line 1250 may electrically connect the first to fourth input terminals 1211 to 1214 and the output terminal 1221. In other words, the first to fourth test signals S1 to S4 may be merged in the transmission line 1250.

The tester 1300 may include an algorithm pattern generator 1310 and first to fourth buffers 1321 to 1324. The algorithm pattern generator 1310 may calculate logical values of commands included in a test pattern. The calculated logical values may be stored in a memory 1315 of the algorithm pattern generator 1310. The algorithm pattern generator 1310 may control the first to fourth buffers 1321 to 1324 depending on the calculated logical values. The first to fourth buffers 1321 to 1324 may transmit the first to fourth test signals S1 to S4 to the test interface board 1200 based on the calculated logical values.

Unlike the tester 230 of FIG. 3, the tester 1300 may not include a circuit (e.g., the multiplexer 233 of FIG. 3) configured to merge the first to fourth test signals S1 to S4 that are outputs of the first to fourth buffers 1321 to 1324. The first to fourth test signals S1 to S4 may be transmitted from the first to fourth buffers 1321 to 1324, respectively, to the first to fourth input terminals 1211 to 1214, respectively. Compared with the testers 130 and 330 of FIGS. 1 and 4, the tester 1300 may output the first to fourth test signals S1 to S4 at different time points such that active periods of the first to fourth test signals S1 to S4 do not overlap one another in the transmission line 1250. Here, a test signal during an active period may be valid or may be decoded by devices (for example, the semiconductor device 1100). The active period of the test signal may be referred to a valid period of the test signal.

In the case of testing the semiconductor device 1100 receiving the first to fourth test signals S1 to S4 through the one input terminal 1111, according to an exemplary embodiment of the inventive concept, the test interface board 1200 and the tester 1300 may not include a circuit (e.g., the multiplexer 233 of FIG. 3 or the multiplexer 321 of FIG. 4) configured to merge the first to fourth test signals S1 to S4. Instead, the test interface board 1200 may include the transmission line 1250 in which the first to fourth test signals S1 to S4 are merged, and the tester 1300 may output the first to fourth test signals S1 to S4 at different time points such that active periods of the first to fourth test signals S1 to S4 do not overlap one another. Accordingly, manufacturing costs of the test interface board 1200 may decrease, and there may be no need to replace the tester 1300, e.g., for different memory devices.

In an exemplary embodiment of the inventive concept, the algorithm pattern generator 1310 may activate one of the first to fourth buffers 1321 to 1324 and may deactivate the remaining buffers. For example, the algorithm pattern generator 1310 may activate the first buffer 1321 to transmit the first test signal S1 and then may deactivate the first buffer 1321. Next, the algorithm pattern generator 1310 may activate the second buffer 1322 to transmit the second test signal S2. In other words, the algorithm pattern generator 1310 may control the first to fourth buffers 1321 to 1324 such that active periods of the first to fourth test signals S1 to S4 do not overlap one another. Waveforms of the first to fourth test signals S1 to S4 will be more fully described with reference to FIG. 7.

In an exemplary embodiment of the inventive concept, the algorithm pattern generator 1310 may control one of the first to fourth buffers 1321 to 1324 depending on logical values of commands included in a test pattern. To adjust a resistance value of the transmission line 1250, the algorithm pattern generator 1310 may control the remaining of the first to fourth buffers 1321 to 1324 depending on fixed logical values, regardless of the logical values of the commands included in the test pattern. For example, when controlling the first buffer 1321 outputting the first test signal S1, the algorithm pattern generator 1310 may fix all outputs of the second to fourth buffers 1322 to 1324 outputting the second to fourth test signals S2 to S4 to a low level (a voltage level corresponding to logic "0") or a high level (a voltage level corresponding to logic "1"). Waveforms of the first to fourth test signals S1 to S4 will be more fully described with reference to FIG. 7.

The tester 1300 may increase the intensity of a merged signal by adjusting a resistance value of the transmission line 1250. The transmission line 1250 may include first to fifth partial transmission lines 1251 to 1255. In the transmission line 1250, the first to fourth partial transmission lines 1251 to 1254 are transmission lines from the first to fourth input terminals 1211 to 1214 to a merge point, and the fifth transmission line 1255 is a transmission line from the merge point to the output terminal 1221. For example, the first partial transmission line 1251 may connect the first terminal 1211 to the merge point. The second partial transmission line 1252 may connect the second terminal 1212 to the merge point. The third partial transmission line 1253 may connect the third terminal 1213 to the merge point. The fourth partial transmission line 1254 may connect the fourth terminal 1214 to the merge point. The fifth transmission line 1255 may connect the merge point to the output terminal 1221.

The first to fourth partial transmission lines 1251 to 1254 may operate as a stub. If outputs of the first to fourth buffers 1321 to 1324 are fixed to a low level, the first to fourth partial transmission lines 1251 to 1254 may operate as a pull-down resistor; if outputs of the first to fourth buffers 1321 to 1324 are fixed to a high level, the first to fourth partial transmission lines 1251 to 1254 may operate as a pull-up resistor. Additionally, if the first to fourth buffers 1321 to 1324 are deactivated, the first to fourth partial transmission lines 1251 to 1254 may be floating.

In an exemplary embodiment of the inventive concept, to increase the intensity of the first to fourth test signals S1 to S4, the algorithm pattern generator 1310 may adjust voltage levels of the first to fourth test signals S1 to S4 (e.g., output voltage levels of the first to fourth buffers 1321 to 1324) depending on the number of the first to fourth test signals S1 to S4. In detail, the algorithm pattern generator 1310 may increase voltage levels of the first to fourth test signals S1 to S4 as the number of the first to fourth test signals S1 to S4 to be merged in the transmission line 1250 increases. Additionally, since a resistance value of the transmission line 1250 increases as the number of the first to fourth test signals S1 to S4 to be merged in the transmission line 1250 increases, voltage levels of the first to fourth test signals S1 to S4 may be proportional to the resistance value of the transmission line 1250. Waveforms of the first to fourth test signals S1 to S4 will be more fully described with reference to FIG. 8.

As described above, the algorithm pattern generator 1310 may include the memory 1315. The memory 1315 may store a plurality of cycle palettes. A cycle palette represents a set of logical values of commands for controlling the semiconductor device 1100. The following Table 2 shows an example of first to fourth cycle palettes CYP1 to CYP4.

TABLE 2

| Pin | CYP1 | CYP2 | | CYP3 | | CYP4 | |
|---|---|---|---|---|---|---|---|
| CA0 | C4 | X0 | C4 | FL | C4 | X9 | X0 | Y0 |
| CA1 | X15 | X1 | C5 | Y3 | C5 | X8 | X1 | Y1 |
| CA2 | X8 | X2 | C6 | Y4 | C6 | X0 | X2 | Y2 |
| CA3 | X9 | X3 | C7 | Y5 | C7 | X1 | X3 | Y3 |
| CA4 | X10 | X4 | Y0 | Y6 | Y0 | X2 | X4 | Y4 |
| CA5 | X11 | X5 | Y1 | Y7 | Y1 | X3 | X5 | Y5 |
| CA6 | X12 | X6 | Y2 | Y8 | Y2 | X4 | X6 | Y6 |
| CA7 | C1 | X7 | C1 | Y9 | Y3 | X5 | X7 | Y7 |
| CA8 | C2 | X13 | C2 | Y10 | Y4 | X6 | X8 | Y8 |
| CA9 | C3 | X14 | C3 | Y11 | X10 | X7 | X9 | Y9 |

Table 2 illustrates a case where the semiconductor device 1100 is one of the memory devices 210 and 310 of FIGS. 3 and 4 and the number of CA terminals CA0 to CA9 is ten. The first cycle palette CYP1 is a set of logical values associated with an activation command, the second cycle palette CYP2 is a set of logical values associated with a write command or a read command, the third cycle palette CYP3 is a set of logical values associated with a precharge command, and the fourth cycle palette CYP4 is a set of logical values associated with an address. In an exemplary embodiment of the inventive concept, the algorithm pattern generator 1310 may allocate one cycle palette per command, and cycle palettes may be different from one another. Logical values disposed at the left column of each cycle palette may be synchronized with a rising edge of a clock and may be transmitted to the semiconductor device 1100. Logical values disposed at the right column of each cycle palette may be synchronized with a falling edge of the clock and may be transmitted to the semiconductor device 1100.

In Table 2, C1 to C9 may represent control bits, X0 to X15 may represent a row address, Y0 to Y11 may represent a column address, and FL (Fixed Low) may represent a logical value fixed to a low level. However, in Table 2, the number of CA terminals, the number of cycle palettes, and a configuration of each cycle palette are only an example.

Figure 7:
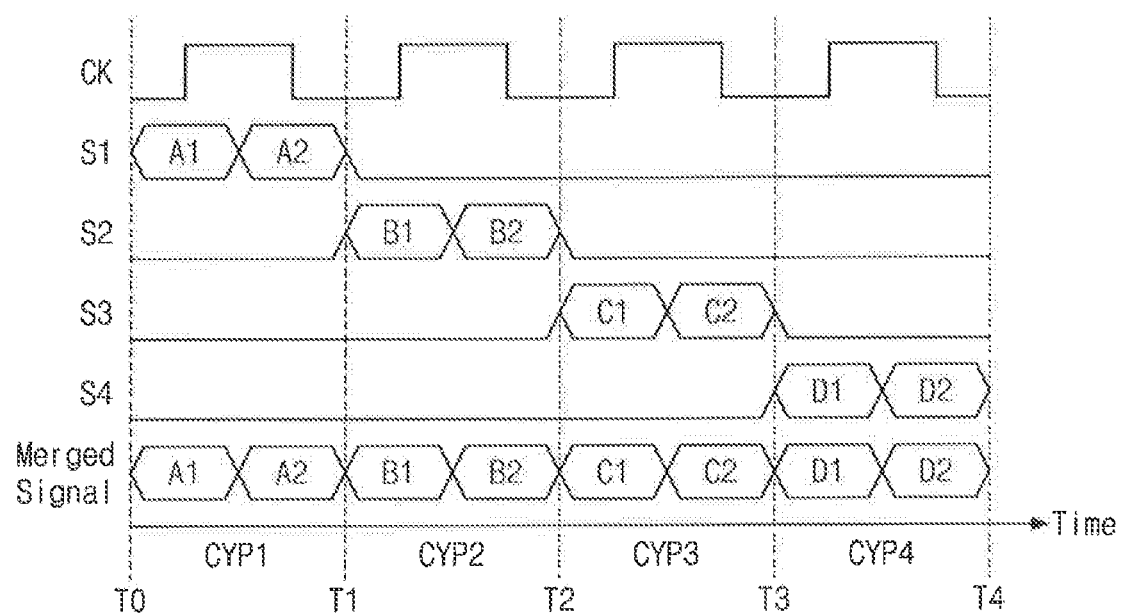
FIG. 7 is a view illustrating waveforms of test signals of FIG. 6 and a signal to which the test signals are merged according to an exemplary embodiment of the inventive concept.

FIG. 7 is a view illustrating waveforms of test signals of FIG. 6 and a signal to which the test signals are merged according to an exemplary embodiment of the inventive concept. FIG. 7 will be described with reference to FIG. 6. Referring to FIG. 7, the first to fourth cycle palettes CYP1 to CYP4 may be sequentially applied to the semiconductor device 1100. Here, the first to fourth cycle palettes CYP1 to CYP4 may be the same as or different from the first to fourth cycle palettes CYP1 to CYP4 described in Table 2.

The first test signal S1 may include a logical value A1 to be synchronized with a rising edge of the clock CK and to be transmitted to the semiconductor device 1100 and a logical value A2 to be synchronized with a falling edge of the clock CK and to be transmitted to the semiconductor device 1100. As in the first test signal S1, the second, third, and fourth test signals S2, S3, and S4 may respectively include logic values B1 and B2, C1 and C2, and D1 and D2.

From a time point T0 to a time point T1, to transmit the logical values A1 and A2 of the first cycle palette CYP1 to the semiconductor device 1100, the algorithm pattern generator 1310 may control the second to fourth buffers 1322 to 1324 to be deactivated or to output fixed logical values while activating or controlling the first buffer 1321. Referring to FIG. 7, outputs of the second to fourth buffers 1322 to 1324 may be fixed to a low level by the algorithm pattern generator 1310.

From the time point T1 to a time point T2, to transmit the logical values B1 and B2 of the second cycle palette CYP2 to the semiconductor device 1100, the algorithm pattern generator 1310 may control the first, third, and fourth buffers 1321, 1323, and 1324 to be deactivated or to output fixed logical values while activating or controlling the second buffer 1322. Referring to FIG. 7, outputs of the first, third, and fourth buffers 1321, 1323, and 1324 may be fixed to a low level by the algorithm pattern generator 1310. An operation of the algorithm pattern generator 1310 from the time point T2 to a time point T4 is similar to the operation of the algorithm pattern generator 1310 from the time point T0 to the time point T2.

From the time point T0 to the time point T4, the algorithm pattern generator 1310 may activate or control the first to fourth buffers 1321 to 1324 at different time points. Accordingly, as illustrated in FIG. 7, phases of the first to fourth test signals S1 to S4 may be different (for example, phase differences may be 90°), and the first to fourth test signals S1 to S4 may not overlap one another.

Figure 8:
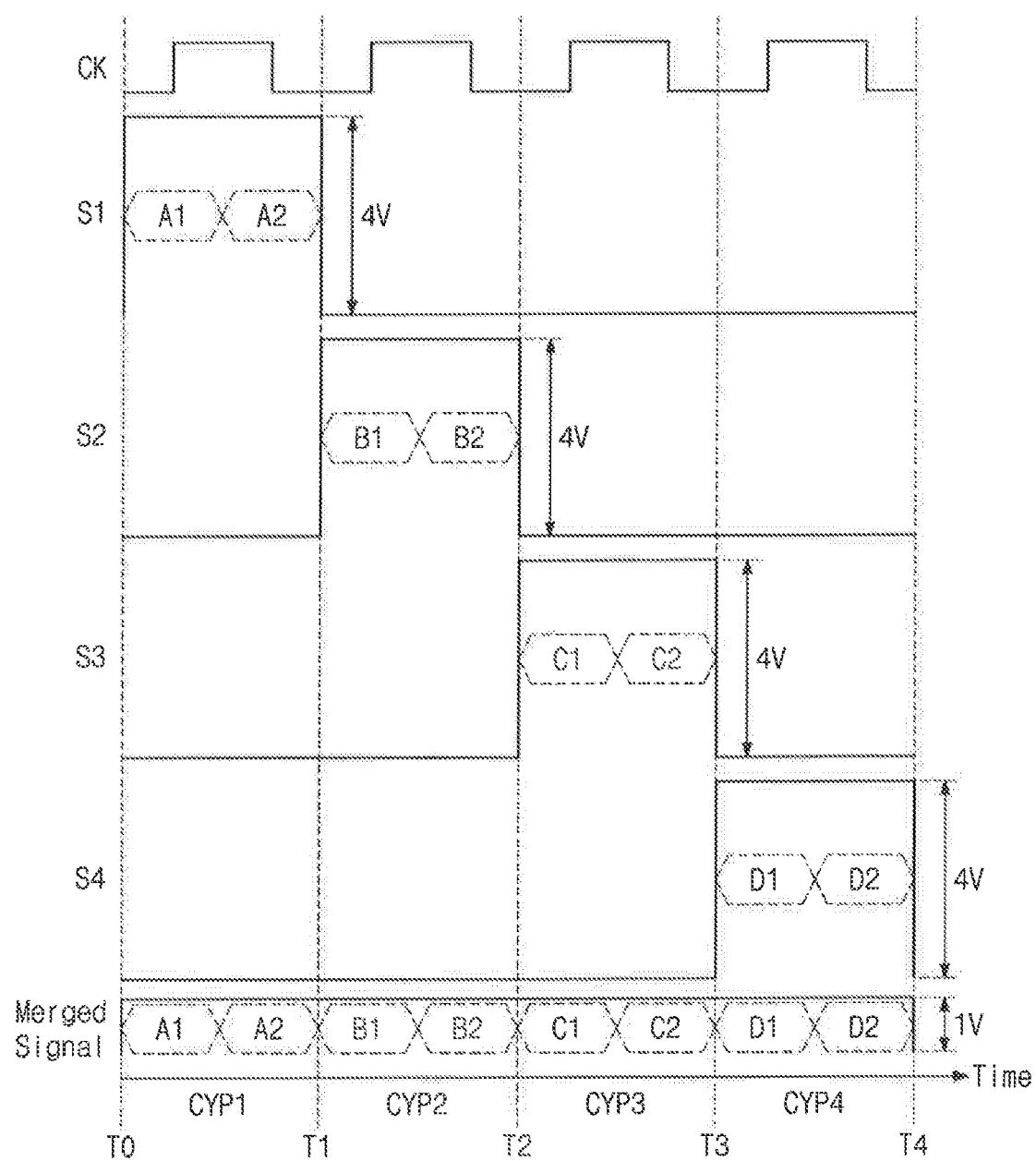
FIG. 8 is a view illustrating waveforms of test signals, the voltage levels of which are adjusted by an algorithm pattern generator of FIG. 6 according to an exemplary embodiment of the inventive concept.

FIG. 8 is a view illustrating waveforms of test signals, the voltage levels of which are adjusted by an algorithm pattern generator of FIG. 6 according to an exemplary embodiment of the inventive concept. FIG. 8 will be described with reference to FIGS. 6 and 7. Voltage levels (marked by a solid line) of the first to fourth test signals S1 to S4 are illustrated in FIG. 8 in addition to the waveforms of FIG. 7.

In FIG. 8, it is assumed that the semiconductor device 1100 receives a signal with a voltage level of 1 V. If the algorithm pattern generator 1310 sets output voltage levels of the first to fourth buffers 1321 to 1324 to a voltage level of 1 V, a voltage level of a merged signal in the transmission line 1250 may be less than 1 V (e.g., 0.25 V), and an intensity or an integrity of the signal transmitted to the semiconductor device 1100 may be decreased. To prevent this issue, the algorithm pattern generator 1310 may adjust output voltage levels of the first to fourth buffers 1321 to 1324 to 4 V, and then a voltage level of the merged signal may be 1 V. The algorithm pattern generator 1310 may adjust an output level of a buffer depending on the number of test signals to be merged in the transmission line 1250 or depending on a resistance value of the transmission line 1250.

Figure 9:
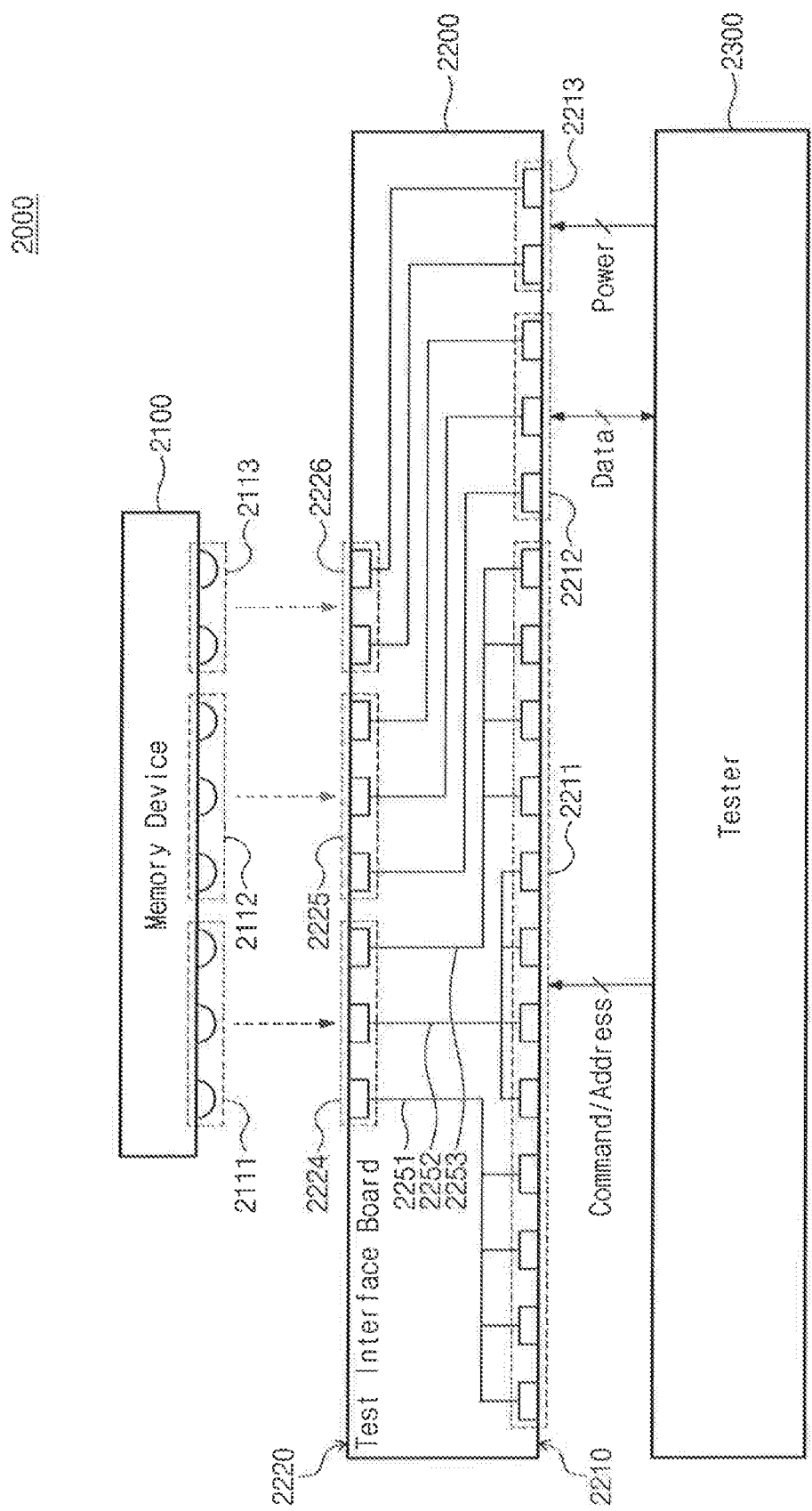
FIG. 9 is a block diagram illustrating the test system of FIG. 6 in detail according to an exemplary embodiment of the inventive concept.

FIG. 9 is a block diagram illustrating the test system of FIG. 6 in detail according to an exemplary embodiment of the inventive concept. FIG. 9 refers to a case where the semiconductor device 1100 is a memory device. Referring to FIG. 9, a test system 2000 may include a memory device 2100, a test interface board 2200, and a tester 2300. In FIG. 9, the number of terminals and a connection relationship thereof are only an example.

The memory device 2100 may include CA terminals 2111, DQ terminals 2112, and power terminals 2113. The CA terminals 2111 are terminals for receiving commands and addresses for controlling the memory device 2100. The CA terminals 2111 may be substantially the same as the CA terminals 211 and 311 of FIGS. 3 and 4. The DQ terminals 2112 are terminals for receiving write data from the tester 2300 and transmitting read data to the tester 2300. The power terminals 2113 are terminals for receiving power from the tester 2300.

The test interface board 2200 may include first terminals 2211, second terminals 2212, and third terminals 2213 disposed on a first plane 2210 of the test interface board 2200, and may include fourth terminals 2224, fifth terminals 2225, and sixth terminals 2226 disposed on a second plane 2220 of the test interface board 2200. Here, the first terminals 2211 may be substantially the same as the first to fourth input terminals 1211 to 1214 of FIG. 6, and the fourth terminals 2224 may be substantially the same as the output terminal 1221 of FIG. 6.

The test interface board 2200 may include transmission lines 2251 to 2253 electrically connecting the first terminals 2211 and the fourth terminals 2224. Each of the transmission lines 2251 to 2253 may be substantially the same as the transmission line 1250 of FIG. 6. According to an exemplary embodiment of the inventive concept, the number of the fourth terminals 2224 is smaller than the number of the first terminals 2211.

The second terminals 2212 may be electrically connected to the tester 2300, and the fifth terminals 2225 may be electrically connected to the DQ terminals 2112 of the memory device 2100 (e.g., via contact). The number of the second terminals 2212 may be the same as the number of the fifth terminals 2225, and the second terminals 2212 may be connected to the fifth terminals 2225 (via a one-to-one connection).

The third terminals 2213 may be electrically connected to the tester 2300, and the sixth terminals 2226 may be electrically connected to the power terminals 2113 of the memory device 2100 (e.g., via contact). The number of the third terminals 2213 may be the same as the number of the sixth terminals 2226, and the number of the third terminals 2213 may be connected to the sixth terminals 2226 (via a one-to-one connection). However, the inventive concept is not limited thereto. Since the third terminals 2213 and the sixth terminals 2226 are terminals for transferring power, the number of the third terminals 2213 and the number of the sixth terminals 2226 may not be the same.

The tester 2300 may perform substantially the same function as the tester 1300 of FIG. 6. The tester 2300 may transmit a command and an address (or test signals) to the first terminals 2211. The tester 2300 may transmit write data to the second terminals 2212 and may receive read data from the second terminals 2212. The tester 2300 may supply power to the memory device 2100 through the third and sixth terminals 2213 and 2226.

Figure 10:
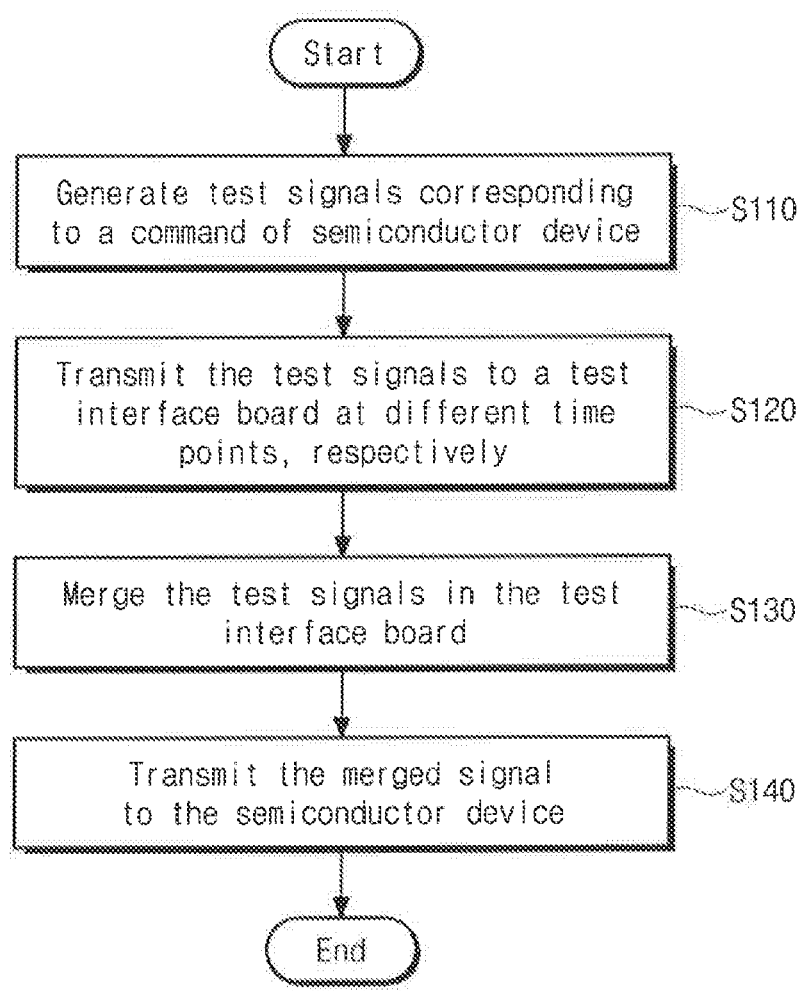
FIG. 10 is a flowchart illustrating a test method according to an exemplary embodiment of the inventive concept.

FIG. 10 is a flowchart illustrating a test method according to an exemplary embodiment of the inventive concept. The flowchart of FIG. 10 relates to operating methods of the tester 1300 and 2300 of FIGS. 6 and 9, respectively. FIG. 10 will be described with reference to FIG. 6.

In operation S110, the tester 1300 may generate test signals (e.g., the first to fourth test signals S1 to S4 of FIG. 6) corresponding to a command of the semiconductor device 1100. In the case where the semiconductor device 1100 is a memory device, the command may comply with the JEDEC standard (e.g., an activation command, a read command, a write command, a precharge command, etc.).

In operation S120, the tester 1300 may transmit the test signals to the test interface board 1200 at different time points. The test signals may be transmitted to be similar to the waveforms of the first to fourth test signals S1 to S4 illustrated in FIG. 7. For example, the tester 1300 may transmit the test signals to the test interface board 1200 such that active periods of the test signals do not overlap one another.

In operation S130, the test signals may be merged in the test interface board 1200. The test interface board 1200 may include a transmission line (e.g., the transmission line 1250 of FIG. 6) for merging the test signals, and may not include a circuit configured to merge the test signals.

In operation S140, the merged signal may be transmitted to the semiconductor device 1100. In detail, if the test signals are merged in operation S130, the merged signal may be output to the semiconductor device 1100 through the output terminal 1221.

Figure 11:
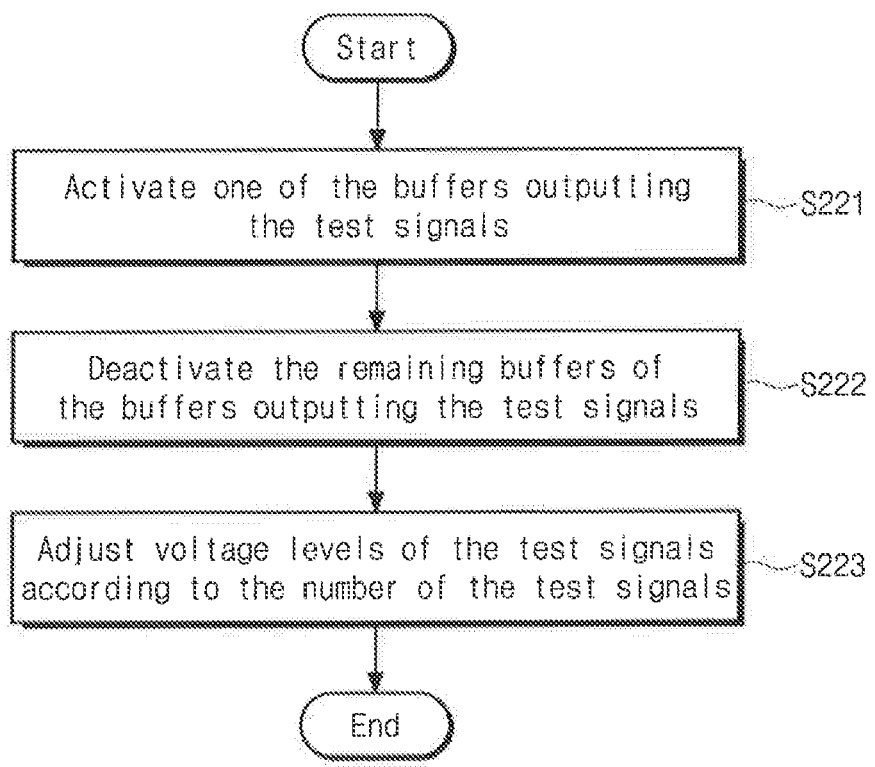
FIG. 11 is a flowchart illustrating an operation of FIG. 10 for transmitting test signals according to an exemplary embodiment of the inventive concept.

FIG. 11 is a flowchart illustrating an operation of FIG. 10 for transmitting test signals according to an exemplary embodiment of the inventive concept. FIG. 11 will be described with reference to FIG. 6.

In operation S221, the algorithm pattern generator 1310 of the tester 1300 may activate one of the buffers (e.g., the first to fourth buffers 1321 to 1324 of FIG. 6) outputting test signals.

In operation S222, the algorithm pattern generator 1310 may deactivate the remaining buffers outputting the test signals other than the one buffer (or the activated buffer). Accordingly, since only one of the test signals is transmitted to the test interface board 1200, and two or more of the test signals are not transmitted to the test interface board 1200, active periods of the test signals may not overlap one another in the test interface board 1200.

In operation S223, the algorithm pattern generator 1310 may adjust voltage levels of the test signals depending on the number of the test signals. The voltage levels of the test signals may be proportional to the number of the test signals. Additionally, the voltage levels of the test signals may be proportional to a resistance value of a transmission line (e.g., the transmission line 1250 of FIG. 6). In an exemplary embodiment of the inventive concept, operation S223 may be performed before operation S221.

Figure 12:
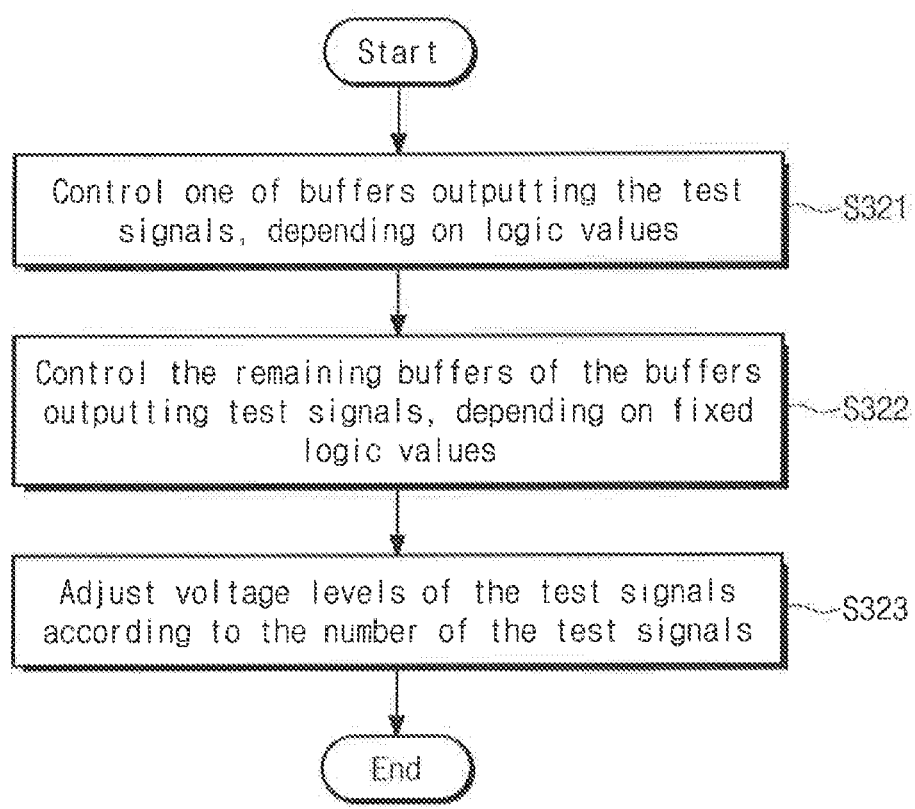
FIG. 12 is a flowchart illustrating the operation of FIG. 10 for transmitting test signals according to an exemplary embodiment of the inventive concept.

FIG. 12 is a flowchart illustrating the operation of FIG. 10 for transmitting test signals according to an exemplary embodiment of the inventive concept. FIG. 12 will be described with reference to FIGS. 6 and 7.

In operation S321, the algorithm pattern generator 1310 of the tester 1300 may control one of the buffers outputting test signals, depending on logical values of the test signals corresponding to a command. Operation S321 may be substantially the same as operation S221 of FIG. 11. Here, the logical values may be calculated by the algorithm pattern generator 1310 based on a test pattern.

In operation S322, the algorithm pattern generator 1310 may control the remaining buffers outputting the test signals, depending on fixed logical values. Here, the fixed logical values are not associated with the logical values of operation S321 and may include one of logic "0" or logic "1". Waveforms of the test signals associated with operation S321 and operation S322 are illustrated in FIG. 7. As described above, in the case where one of the test signals (e.g., the first to fourth test signals S1 to S4) is transmitted to the test interface board 1200, the remaining test signals may be maintained with fixed logical values.

In operation S323, the algorithm pattern generator 1310 may adjust voltage levels of the test signals depending on the number of the test signals. The voltage levels of the test signals may be proportional to the number of the test signals. Additionally, the voltage levels of the test signals may be proportional to a resistance value of a transmission line (e.g., the transmission line 1250 of FIG. 6). In an exemplary embodiment of the inventive concept, operation S323 may be performed before operation S321.

Thus, as described above, according to exemplary embodiments of the inventive concept, in the case of testing a semiconductor device receiving at least two test signals through one input terminal, a test interface board and a tester may not include a circuit configured to merge the test signals. Accordingly, manufacturing costs of the test interface board may decrease, and there may be no need to replace the tester.

While the inventive concept has been described with reference to exemplary embodiments thereof, it will be apparent to those of ordinary skill in the art that various changes and modifications in form and detail may be made thereto without departing from the spirit and scope of the inventive concept, as set forth by the following claims.

What is claimed is:

1. A test interface board comprising:
   a first input terminal configured to receive a first test signal for testing a semiconductor device;
   a second input terminal configured to receive a second test signal for testing the semiconductor device;
   an output terminal configured to output the first test signal and the second test signal to the semiconductor device; and
   a transmission line electrically connecting the first input terminal, the second input terminal, and the output terminal, such that the first test signal and the second test signal are merged in the transmission line and output to the output terminal,
   wherein an active period of the second test signal and an active period of the first test signal do not overlap each other.

2. The test interface board of claim 1, wherein a circuit configured to merge the first test signal and the second test signal is not included in the test interface board.

3. The test interface board of claim 1, wherein voltage levels of the first test signal and the second test signal are proportional to a resistance value of the transmission line.

4. The test interface board of claim 1, wherein the transmission line comprises:
   a first partial transmission line connecting the first terminal to a merge point;
   a second partial transmission line connecting the second terminal to the merge point; and
   a third partial transmission line connecting the merge point to the output terminal.

5. The test interface board of claim 4, wherein when the first test signal is input to the first terminal, a voltage level of the second test signal is one of a voltage level corresponding to logic "0" or a voltage level corresponding to logic "1".

6. The test interface board of claim 5,
   wherein when the voltage level of the second test signal is the voltage level corresponding to logic "0", the second partial transmission line operates as a pull-down resistor; and
   wherein when the voltage level of the second test signal is the voltage level corresponding to logic "1", the second partial transmission line operates as a pull-up resistor.

7. The test interface board of claim 4, wherein when the first test signal is input to the first input terminal, the second partial transmission line is floating.

8. The test interface board of claim 1,
   wherein the semiconductor device is a memory device comprising a memory cell, and
   wherein the first and the second test signals are signals that transmit a command controlling the memory cell and an address of the memory cell to the memory device.

9. A test system comprising:
   a semiconductor device; and
   a test interface board comprising input terminals configured to receive test signals for testing the semiconductor device, an output terminal configured to output the test signals as a merged signal to the semiconductor device and apply the merged signal to the semiconductor device, and a transmission line electrically connecting the input terminals and the output terminal,
   wherein the transmission line includes first partial transmission lines each connected to one of the input terminals and a second partial transmission line connected to the output terminal, and a merge point connecting the first partial transmission lines with the second partial transmission line.

10. The test system of claim 9, wherein a total number of the output terminal is smaller than a total number of the input terminals.

11. The test system of claim 9, wherein the test interface board does not include a circuit configured to merge the test signals.

12. The test system of claim 9, further comprising:
a tester configured to generate the test signals such that active periods of the test signals do not overlap one another.

13. The test system of claim 12, wherein the tester does not include a circuit configured to merge the test signals.

* * * * *